United States Patent

Ajika et al.

[11] Patent Number: 5,600,164
[45] Date of Patent: Feb. 4, 1997

[54] NON-VOLATILE SEMICONDUCTOR MEMORY DEVICE

[75] Inventors: Natsuo Ajika; Masahiro Hatanaka, both of Hyogo, Japan

[73] Assignee: Mitsubishi Denki Kabushiki Kaisha, Tokyo, Japan

[21] Appl. No.: 536,300

[22] Filed: Sep. 29, 1995

[30] Foreign Application Priority Data

Mar. 13, 1995 [JP] Japan .................................... 7-052276

[51] Int. Cl.⁶ .............................. H01L 27/02; H01L 29/78
[52] U.S. Cl. ............................................ 257/321; 257/392
[58] Field of Search ..................................... 257/316, 315, 257/319, 321, 326, 392

[56] References Cited

U.S. PATENT DOCUMENTS

| | | | |
|---|---|---|---|
| 4,471,373 | 9/1984 | Shimizu et al. | 257/392 |
| 5,194,924 | 3/1993 | Komori et al. | 257/316 |
| 5,237,188 | 8/1993 | Iwai et al. | 257/325 |

OTHER PUBLICATIONS

"Stress Induced Leakage Current Limiting to Scale Down EEPROM Tunnel Oxide Thickness", by K. Naruke et al., IDEM 88 pp. 424–427 no date.

"Flash EEPROM Cell Scaling Based on Tunnel Oxide Thinning Limitations", by K. Yoshikawa et al., Symposium on VLSI Technology Digest (1991) pp. 79–80 no month.

Primary Examiner—Donald L. Monin, Jr.
Attorney, Agent, or Firm—Lowe, Price, LeBlanc & Becker

[57] ABSTRACT

An object of the present invention is to achieve an improved flash memory which enables to simultaneously obtain high performance and reliability even with voltage $V_{CC}$ of 3.3 V or below. The device includes a memory cell 6, a $V_{CC}$ type transistor 7 and a $V_{PP}$ type transistor 8. Memory cell 6 includes a tunnel oxide film 2, a floating gate 3 and a control gate 4. A $V_{CC}$ type transistor 7 includes a first gate insulating film 9 and a first gate 10. A $V_{PP}$ type transistor 8 includes a second gate insulating film 11 and a second gate 12. An inequality, $t(V_{CC}) < t(TN) < t(V_{PP})$, is satisfied where $t(TN)$ is the thickness of the tunnel oxide film, $t(V_{CC})$ is the thickness of the first gate insulating film, and $t(V_{PP})$ is the thickness of the second gate insulating film.

14 Claims, 4 Drawing Sheets

NON-VOLATILE SEMICONDUCTOR MEMORY DEVICE

BACKGROUND OF THE INVENTION

1. Field of the Invention

The present invention generally relates t non-volatile semiconductor memory devices and, more particularly, to a non-volatile semiconductor memory device (hereinafter referred to as a flash memory) which is capable of electrical programming and erasing of data and employs a floating gate.

2. Description of the Background Art

FIG. 4 is a cross sectional view showing a conventional flash memory.

This memory cell has two gate electrodes; a floating gate 3 completely covered with a silicon oxide film and a control gate 4 stacked thereon. A tunnel oxide film 2 which is a thin (80–100 Å) oxide film is provided between floating gate 3 and a semiconductor substrate 1. For writing or erasing of the data, electrons are introduced to or emitted from floating gate 3 by a current flowing through tunnel oxide film 2 (a tunnel current).

A threshold voltage of a transistor (a gate voltage obtained when a drain current starts to flow) is changed by whether electrons are present in floating gate 3 or not. Since the drain current changes by the change in the threshold, "0" and "1" are distinguished from each other by the amount of the drain current. Such a memory cell is called a non-volatile memory cell because electrons remaining in floating gate 3 will not be lost even by turning off the power supply unless light is directed thereto. A kind of non-volatile memory which can write and erase data electrically is called a flash memory.

FIG. 5 is a cross sectional view of a flash memory showing only such a flash memory cell as described above and peripheral transistors. The flash memory basically includes a memory cell 6, a $V_{CC}$ type transistor 7 and a $V_{PP}$ type transistor 8. $V_{CC}$ type transistor 7 is a switching transistor for a supply voltage ($V_{CC}$). $V_{PP}$ type transistor 8 is a programming transistor for applying a high voltage $V_{PP}$ to control gate 4.

Memory cell 6 includes tunnel oxide film 2, floating gate 3 and control gate 4, as described above. $V_{CC}$ type transistor 7 includes a first gate insulating film 9 and a first gate 10. $V_{PP}$ type transistor 8 includes a second gate insulating film 11 and a second gate 12. A conventional flash memory satisfies the following inequality:

$$t(TN) < t(V_{CC}) < t(V_{PP}) \quad (1)$$

where t(TN) is a film thickness of tunnel oxide film 2, $t(V_{CC})$ is a film thickness of first gate insulating film 9, and $t(V_{PP})$ is a film thickness of second gate insulating film 11. In the conventional flash memory, a voltage of 5V is applied to $V_{CC}$ type transistor 7, and a voltage of 12V is applied to $V_{PP}$ type transistor 8.

Since flash memories are scaled down, there is a problem with a conventional flash memory structured in accordance with the inequality above. This problem will be described below in detail.

First, let us consider the electronic field applied to tunnel oxide film 2. Assuming that the amount of stored charges is approximately 10 fC/cell at present, when a scaling factor is k (k is a multiplier less than 1), the amount of stored charges will be k×10 fC/cell. In any generation, the charges must be extracted in approximately one second at most. Assuming that the area electrons pass through when charges are extracted is about 0.1 μm² (at present), this area will be k×0.1 μm² correspondingly (although the area might be k²×0.1 μm² in some cases, it will not make any big difference to the discussion here). Therefore, a current density I (tunnel) of 10 μA/cm² must be ensured in any generation, as obtained from the following expression:

Current density I (tunnel)>(k×10 fC)/(k×0.1 μm²) ÷10 μA/cm²

As long as charges are extracted by utilizing the Fowler-Nordheim tunnel phenomenon, current density J is obtained by the following expressions:

J (FN)÷AE² exp (–B/E)
A=q² m/8πhφ$_b$m*÷1.47×10⁻⁶ (A/V²)
B=–(4 (2m*)^{1/2} (qφ$_b$)^{3/2}/3qh)÷2.37×10¹⁰ (V/m)

where E is the electric field applied to an oxide film, q is elementary charges, m is the mass of an electron, h is the Planck's constant, $φ_b$ is the barrier height against the oxide film, m* is the effective mass of an electron.

As can be seen from the expressions above, the electric field of at least 10 MV/cm must be ensured for the tunnel oxide film in any generation in order to obtain current density J of 10 μA/cm². Here, the electric field applied to the tunnel oxide film is defined as E(TN).

Although actually there are various methods of applying voltage to tunnel oxide film 2, it is assumed here for simplicity that a voltage of t(TN)×E(TN) must be handled in chip where t(TN) is the film thickness of tunnel oxide film 2. In other words, a high voltage $V_{PP}$ in chip can be expressed by the following equation;

In-chip high voltage $V_{PP}$=t(TN)×E(TN)

Now, the film thickness of the gate oxide film of peripheral transistors handling the high voltage will be considered. Generally, when a voltage is applied to a silicon oxide film, the silicon oxide film will break down in a finite time. The life of a silicon oxide film is a function of the applied electric field and the area of the oxide film. (Although it is also related to the film thickness of the oxide film, it is not taken into consideration here because its effect is small.)

FIG. 6 shows the relationship between the life (sec) of a silicon oxide film and the applied electric field (Eg). As can be seen from FIG. 6, the life of a silicon oxide film is shortened as the applied voltage increases. From the figure, the electric field E($V_{PP}$) applied to the gate oxide film in a $V_{PP}$ type transistor must be less than 5 MV/cm so as to secure the life of ten years (÷3×10⁸ second). Therefore, the expression of E($V_{PP}$)<5 MV/cm must be satisfied.

Considering the effects of the area and the fact that $V_{PP}$ is not actually applied for as long as ten years, the expression of E($V_{PP}$)<3–7 MV/cm must be satisfied.

From the consideration above, the film thickness $t(V_{PP})$ of the gate oxide film in a $V_{PP}$ type transistor can be obtained from the following expressions:

$$t(V_{PP}) = t(TN) \times E(TN)/E(V_{PP})$$
$$\approx t(TN) \times 1.5{-}3.3$$

Therefore, if an oxide film having a thickness of 100 Å is used as tunnel oxide film 2, the thickness of the gate oxide film in the $V_{PP}$ type transistor is suitably 150 Å–330 Å.

Next, $V_{CC}$ type transistors will be considered. Regarding $V_{CC}$ type transistors as well, the life of ten years must be secured and, in that order, electric field E($V_{CC}$) applied to the gate insulating film in the $V_{CC}$ type transistor must be less than 3–5 MV/cm, as can be seen from FIG. 6. That is, E($V_{CC}$)<3–5 MV/cm. Therefore, when $V_{CC}$=5V, thickness $t(V_{CC})$ of the gate oxide film in the $V_{CC}$ type transistor is 100 Å–170 Å.

Since $V_{CC}$ of 5V is utilized in the conventional device, a flash memory satisfying the inequality (1) above has excelled in performance.

As long as reliability is secured, a transistor having a thinner gate oxide film enjoys the greater improvement in performance and thus is more advantageous in terms of performance of a chip such as access. Furthermore, it can be seen from the foregoing that if the voltage is scaled down, the thickness of the gate oxide film can be reduced in proportion thereto.

Meanwhile, regarding the scaling of the thickness of the tunnel oxide film, Naruke, et al. has pointed out a stress-induced leakage current at low electric field, which is the lower limit of the reliability (K. Naruke, et al., IEDM Tech. Dig., (1988) pp. 424).

Taking this point into consideration, scaling of the tunnel oxide film is said to be $k^{0.25}$ (K. Yoshikawa, et al., Sympo. of VSLI Tech. Dig., (1991), pp. 79). According to Yoshikawa, et al., the thickness of the tunnel oxide film remains to be around 100 Å even in the 64M (~0.4 μm rule) generation.

Meantime, in order to achieve the best performance of the transistor with the given $V_{CC}$ as long as reliability is secured, the thickness of the transistor must be set as $t(V_{CC})=V_{CC}/E(V_{CC})$. This results in $t(V_{CC})$ equal to 70 Å–100 Å in the generation where $V_{CC}=3.3V$. Therefore, in the generation where $V_{CC}=3.3V$, a conventional semiconductor device satisfying the expression (1) above cannot achieve a high reliability. More specifically, if the expression (1) above is to be satisfied, t(TN) must be less than 70 Å because $t(V_{CC})>t(TN)$.

However, such a small amount of t(TN) gives rise to a problem of reliability, that is, a stress-induced leakage current at low electric field.

SUMMARY OF THE INVENTION

The present invention is conceived for solving the above-described problems and an object thereof is to provide a flash memory which enables to obtain both good performance and reliability even in the generation where $V_{CC}$ equals to 3.3V.

A non-volatile semiconductor memory device in accordance with the present invention is provided with a memory cell including a tunnel oxide film, a floating gate and a control gate. The device is also provided with a first transistor including a first gate insulating film and a first gate and driving a first voltage and a second transistor including a second gate insulating film and a second gate and driving a second voltage which has an absolute value greater than the first voltage. The expression of $t(V_{CC})<t(TN)$ is satisfied where t(TN) is the thickness of the tunnel oxide film and $t(V_{CC})$ is the thickness of the first gate insulating film.

According to the non-volatile semiconductor memory device in accordance with the present invention, thickness $t(V_{CC})$ of the gate insulating film of the first transistor can be made small without reducing thickness t(TN) of the tunnel oxide film because $t(V_{CC})$ is less than t(TN).

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described with reference to the drawings.

EMBODIMENT 1

Figure 1:
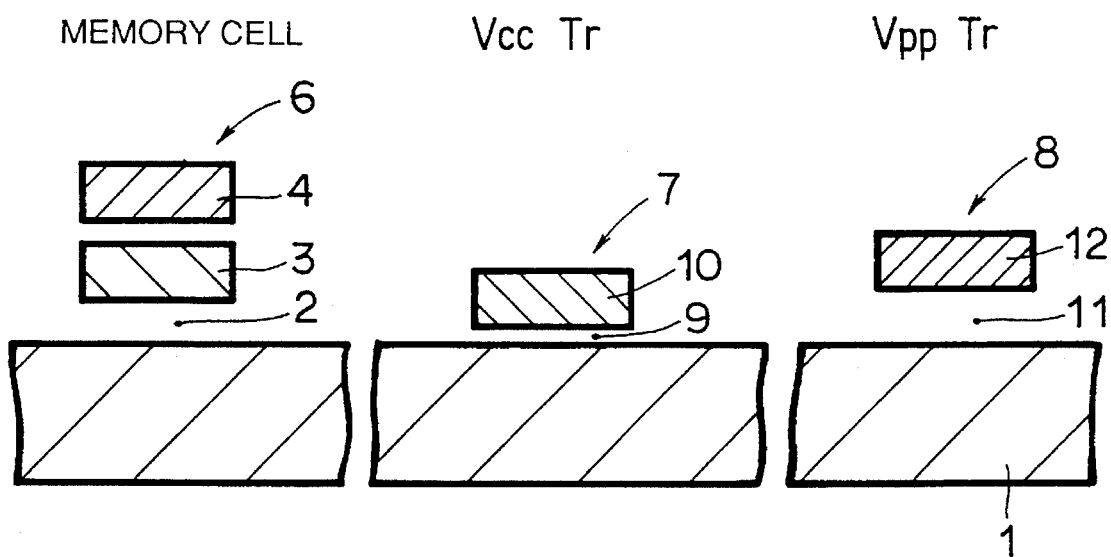
FIG. 1 is a cross sectional view of a flash memory in accordance with a first embodiment.

FIG. 1 is a cross sectional view of a flash memory in accordance with the first embodiment. Referring to FIG. 1, the flash memory in accordance with the present embodiment includes a semiconductor substrate 1. A memory cell 6 including a tunnel oxide film 2, a floating gate 3 and a control gate 4 is provided on semiconductor substrate 1. The device is also provided with a $V_{CC}$ type transistor 7 provided on the semiconductor substrate and including a first gate insulating film 9 and a first gate 10. The device is further provided with a $V_{PP}$ type transistor 8 provided on semiconductor substrate 1 and including a second gate insulating film 11 and a second gate 12. The following relation is established among a thickness t(TN) of tunnel oxide film 2 in memory cell 6, a thickness $t(V_{CC})$ of first gate insulating film 9 in $V_{CC}$ type transistor 8, and thickness $t(V_{PP})$ of second gate insulating film 11 in the $V_{PP}$ type transistor:

$t(V_{CC})<t(TN)<t(V_{PP})$

When the voltage is reduced and $V_{CC}$ becomes 3.3 V or below, $t(V_{CC})$ must have the thickness of 70 Å–100 Å. However, since the relationship above is established, $t(V_{CC})$ can be made 70 Å–100 Å while maintaining the thickness of the tunnel oxide film around 100 Å. Furthermore, tunnel oxide film 2 will not break down and a stress-induced leakage current at low electric field will not be generated. As a result, loss of data caused by the breakdown of tunnel oxide film 2 can be prevented.

The tunnel oxide film is preferably formed by thermal oxidation rather than by the CVD method.

Preferably, $t(V_{CC})$ is 40–100 Å, t(TN) is 70–110 Å, and $t(V_{PP})$ is 100–180 Å. Preferably, nitrogen atoms are included in at least one of the tunnel oxide film, first gate insulating film 9 and second gate insulating film 11. Most preferably, nitrogen atoms are included in the tunnel oxide film.

By introducing nitrogen atoms into the oxide film, the life is extended and leakage current is decreased. Nitrogen atoms can be introduced into the oxide film by annealing the oxide film in the $N_2$, $NH_3$ or NO atmosphere.

EMBODIMENT 2

Figure 2:
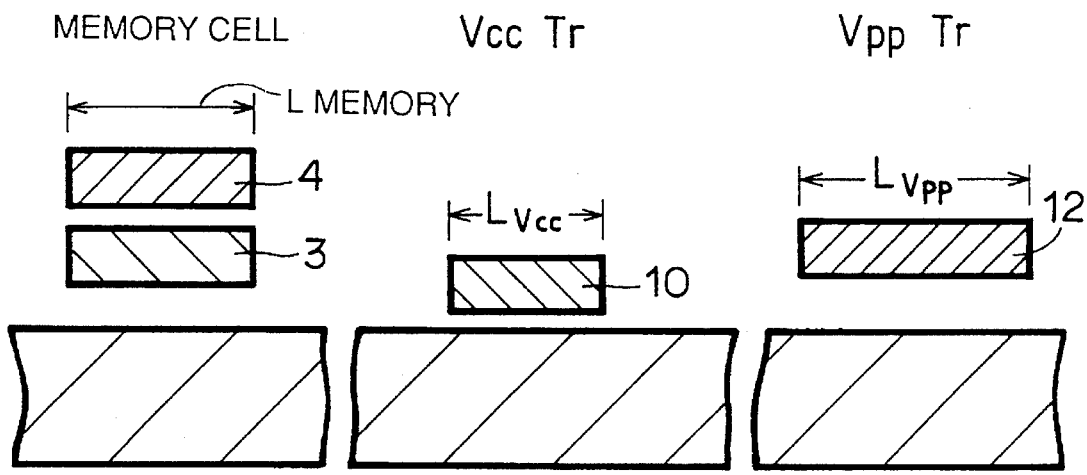
FIG. 2 is a cross sectional view of a flash memory in accordance with a second embodiment.

Although respective gate lengths of control gate 4, first gate 10 and second gate 12 are equal to one another in the first embodiment, the present invention is not limited thereto. As shown in FIG. 2, the gate lengths of these gates may be varied. Generally, the minimum gate length Lmin of an MOS transistor can be made shorter as the thickness of the gate oxide film deceases. The shorter the gate length is, the higher performance of the transistor can be achieved.

As shown in FIG. 2, most preferably, the following relationship is established among a gate length L (memory) of control gate 4, a gate length L ($V_{CC}$) of first gate 10, and the gate length L ($V_{PP}$) of second gate 12:

$$L(V_{CC}) < L(memory) < L(V_{PP})$$

EMBODIMENT 3

Figure 3:
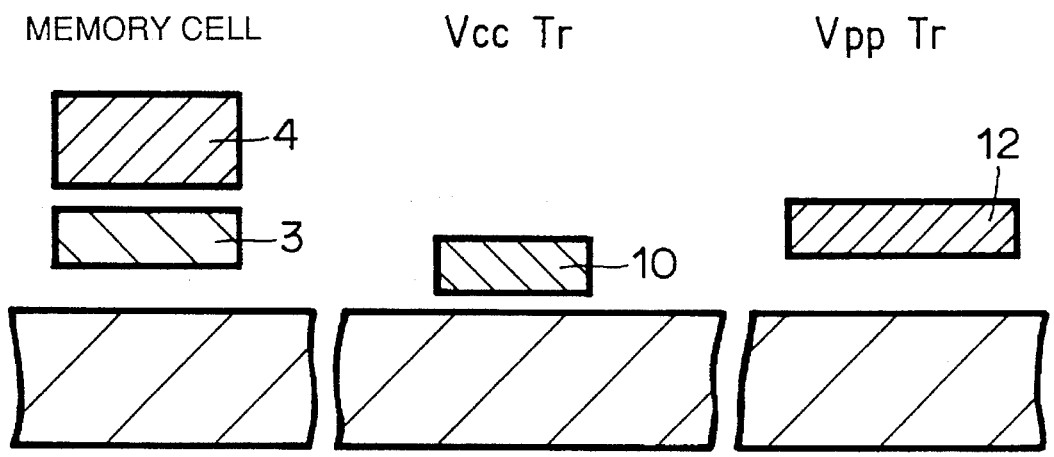
FIG. 3 is a cross sectional view of a flash memory in accordance with a third embodiment.
Figure 4:
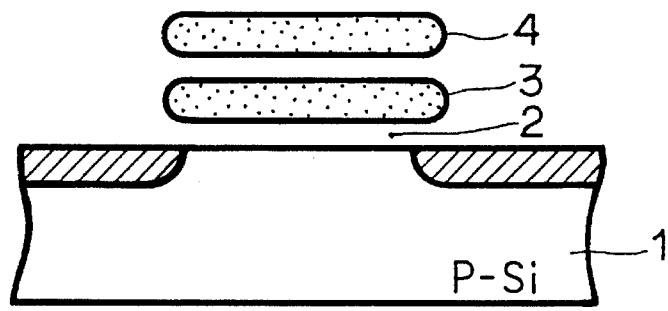
FIG. 4 is a cross sectional view of a conventional flash memory cell.
Figure 5:
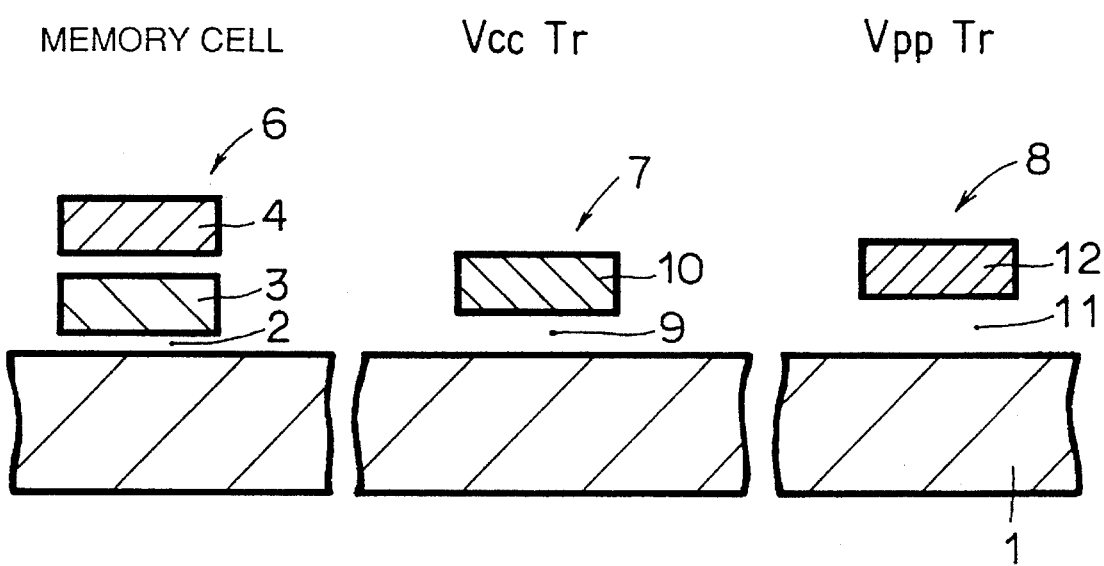
FIG. 5 is a cross sectional view of a conventional flash memory.
Figure 6:
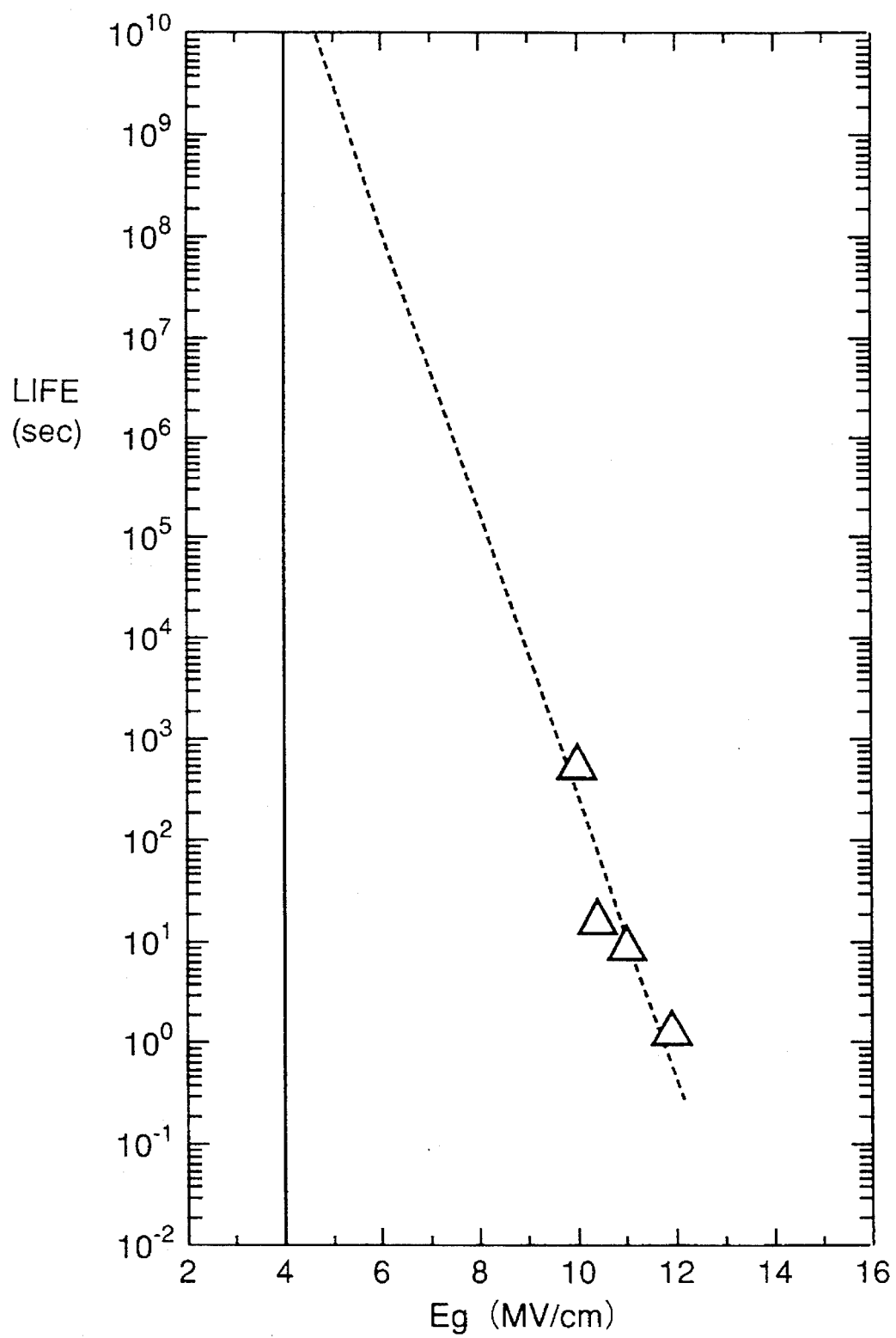
FIG. 6 shows the relation between the electric field and the life of a silicon oxide film.

Although the thickness of floating gate 3 is equal to that of control gate 4 in the first and second embodiments, the present invention is limited thereto. Referring to FIG. 3, the thickness of control gate 4 can be made greater than that of floating gate 3.

Reliability of a semiconductor device is improved by having a thickness of control gate 4 greater than that of floating gate 3.

As described above, in accordance with the present invention, an insulating film of a $V_{CC}$ type transistor can be made as thin as possible while maintaining the thickness of a tunnel oxide film at a fixed value. As a result, even when the voltage is reduced and $V_{CC}$ becomes 3.3 V or below, high reliability and performance (such as high-speed access) of a flash memory can be obtained simultaneously.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:

a memory cell including a tunnel oxide film, a floating gate and a control gate;

a first transistor including a first gate insulating film and a first gate and driving a first voltage; and a second transistor including a second gate insulating film and a second gate and driving a second voltage which has an absolute value greater than that of said first voltage;

wherein an inequality of T1<t (TN) is satisfied where t (TN) is a thickness of said tunnel oxide film and T1 is a thickness of said first gate insulating film.

2. The non-volatile semiconductor memory device according to claim 1, wherein an inequality of T1<t (TN)<T2 is satisfied where T2 is a thickness of said second gate insulating film.

3. The non-volatile semiconductor memory device according to claim 2, wherein an inequality of L1<L<L2 is satisfied where L (memory) is a gate length of said control gate, L1 is a gate length of said first gate, and L2 is a gate length of said second gate.

4. The non-volatile semiconductor memory device according to claim 1, wherein said tunnel oxide film is formed by a thermally oxidized film.

5. The non-volatile semiconductor memory device according to claim 2, wherein said T1 is 40–100 Å, said t(TN) is 70–110 Å, and said T2 is 100–180 Å.

6. The non-volatile semiconductor memory device according to claim 1, wherein said first transistor is utilized with its voltage being equal to 3.3 V or below.

7. The non-volatile semiconductor memory device according to claim 1, wherein nitrogen atoms are included in at least one of said tunnel oxide film, said first gate insulating film and said second gate insulating film.

8. The non-volatile semiconductor memory device according to claim 7, wherein said nitrogen atoms are included in said tunnel oxide film.

9. The non-volatile semiconductor memory device according to claim 1, wherein a thickness of said control gate is greater than a thickness of said floating gate.

10. The non-volatile semiconductor memory device according to claim 1, wherein the first transistor is utilized with its voltage less than 5V.

11. The non-volatile semiconductor memory device according to claim 1, which is capable of electrically programming and electrically erasing data.

12. A non-volatile semiconductor memory device comprising:

a memory cell including an oxide film, a floating gate on the oxide film, and a control gate on the floating gate with an insulating layer therebetween;

a first transistor including a first gate insulating film and a first gate and driving a first voltage; and a second transistor including a second gate insulating film and a second gate and driving a second voltage which has an absolute value greater than that of said first voltage;

wherein an inequality of T1<T is satisfied where T is a thickness of said oxide film and T1 is a thickness of said first gate insulating film.

13. The non-volatile semiconductor memory device according to claim 12, which is capable of electrically programming and electrically erasing data.

14. A non-volatile semiconductor memory device, which is capable of electrically programming and electrically erasing data, comprising:

a memory cell including a tunnel oxide film, a floating gate and a control gate;

a first transistor including a first gate insulating film and a first gate and driving a first voltage, and a second transistor including a second gate insulating film and a second gate and driving a second voltage which has an absolute voltage greater than that of said first voltage;

wherein the following inequality is satisfied where T1 is a thickness of said first gate insulating film, t(TN) is a thickness of said tunnel oxide film, and T2 is a thickness of said second gate insulating film: T1<t(TN)<T2.

* * * * *